(12) United States Patent
Breil

(10) Patent No.: US 9,379,207 B2
(45) Date of Patent: Jun. 28, 2016

(54) STABLE NICKEL SILICIDE FORMATION WITH FLUORINE INCORPORATION AND RELATED IC STRUCTURE

(71) Applicant: GLOBALFOUNDRIES INC., Grand Cayman (KY)

(72) Inventor: Nicolas L. Breil, Beacon, NY (US)

(73) Assignee: GlobalFoundries, Inc., Grand Cayman (KY)

(*) Notice: Subject to any disclaimer, the term of this patent is extended or adjusted under 35 U.S.C. 154(b) by 125 days.

(21) Appl. No.: 14/302,585

(22) Filed: Jun. 12, 2014

(65) Prior Publication Data
US 2015/0364571 A1    Dec. 17, 2015

(51) Int. Cl.
| | |
|---|---|
| H01L 29/66 | (2006.01) |
| H01L 21/3065 | (2006.01) |
| H01L 29/45 | (2006.01) |
| H01L 21/285 | (2006.01) |
| H01L 21/3205 | (2006.01) |
| H01L 21/8238 | (2006.01) |
| H01L 29/78 | (2006.01) |
| H01L 21/268 | (2006.01) |
| H01L 21/28 | (2006.01) |
| H01L 29/417 | (2006.01) |
| H01L 21/324 | (2006.01) |

(52) U.S. Cl.
CPC ............ *H01L 29/665* (2013.01); *H01L 21/268* (2013.01); *H01L 21/28052* (2013.01); *H01L 21/28518* (2013.01); *H01L 21/3065* (2013.01); *H01L 21/32051* (2013.01); *H01L 21/823814* (2013.01); *H01L 29/41725* (2013.01); *H01L 29/456* (2013.01); *H01L 29/66515* (2013.01); *H01L 29/7833* (2013.01); *H01L 21/324* (2013.01)

(58) Field of Classification Search
CPC ............ H01L 29/665; H01L 29/66515; H01L 29/7833; H01L 29/456; H01L 21/8238; H01L 21/823835; H01L 21/324; H01L 21/28052; H01L 21/32051
See application file for complete search history.

(56) References Cited

U.S. PATENT DOCUMENTS

| | | | |
|---|---|---|---|
| 6,534,354 B1* | 3/2003 | Lee ........................ | H01L 21/265 257/E21.334 |
| 6,720,258 B2 | 4/2004 | Maa et al. | |
| 6,838,363 B2 | 1/2005 | Wieczorek et al. | |
| 7,208,409 B2* | 4/2007 | Lu ...................... | H01L 21/26506 257/E21.165 |
| 7,247,915 B2* | 7/2007 | Chang ............... | H01L 21/28518 257/377 |
| 7,335,606 B2 | 2/2008 | Chi et al. | |
| 7,422,968 B2 | 9/2008 | Lu et al. | |
| 8,247,319 B1 | 8/2012 | Fletcher et al. | |
| 8,586,463 B2* | 11/2013 | Nemouchi ........ | H01L 21/28518 257/250 |
| 2010/0117238 A1 | 5/2010 | Nemouchi et al. | |
| 2013/0343121 A1* | 12/2013 | Fukutome ....... | H01L 21/823807 365/182 |

* cited by examiner

Primary Examiner — Michael Trinh
(74) Attorney, Agent, or Firm — Yuanmin Cai; Hoffman Warnick LLC

(57) ABSTRACT

A method of forming a stable nickel silicide layer is provided. The method may include forming a nickel silicide layer on a substrate. A fluorine-rich nickel layer is formed over the nickel silicide layer. The fluorine-rich nickel layer is subjected to a process that drives the fluorine in the fluorine-rich nickel layer into the nickel silicide layer thereunder.

17 Claims, 11 Drawing Sheets

STABLE NICKEL SILICIDE FORMATION WITH FLUORINE INCORPORATION AND RELATED IC STRUCTURE

BACKGROUND

1. Technical Field

The present disclosure relates to silicide formation, and more specifically, to methods of forming nickel silicide with fluorine incorporation and a related IC structure.

2. Related Art

Silicide is a metal-silicon alloy commonly used in complementary metal-oxide semiconductor (CMOS) technology for the purpose of, inter alia, providing a quality conductivity interface between silicon and metal contacts. Silicide may be formed by, e.g., performing an in-situ pre-clean, depositing a metal such as titanium, nickel, cobalt, etc., annealing to have the metal react with silicon, and removing unreacted metal using an etch.

Nickel silicide is a commonly used form of silicide. One challenge relative to the use of nickel silicide in CMOS technology, however, is that it can be unstable. For example, any defects in a silicon substrate crystal or in a source/drain region may lead to nickel silicide migration and, in particular, nickel migration, which can cause a large variety of defects such as nickel encroachments, fangs, opens, etc. The migration can occur during, for example, post-silicide formation processing such as anneals. One approach to prevent nickel migration is to incorporate fluorine in the nickel silicide, which increases the temperature at which the silicide becomes unstable (i.e., an agglomeration temperature) and reduces nickel migration. More specifically, the fluorine acts to fix the nickel in place, but does not impact silicide formation temperatures ($Ni_2Si$ or $NiSi$). Current techniques for incorporating fluorine into silicide all include ion implantation. In one case, the fluorine ion implantation is directed at the already-formed nickel silicide layer. This approach can create a lot of damage in the silicide due to the sputtering effect leading to defects, leakage, etc. In another case, the fluorine ion implantation is directed at the substrate upon which the silicide is later formed. In this situation, the fluorine presence in the substrate may be detrimental to the device later created therein, and may impact overall performance of the device.

SUMMARY

A first aspect of the invention is directed to a method of forming a stable nickel silicide layer, the method comprising: forming a nickel silicide layer on a substrate; forming a fluorine-rich nickel layer over the nickel silicide layer; and subjecting the fluorine-rich nickel layer to a process that drives the fluorine in the fluorine-rich nickel layer into the nickel silicide layer thereunder.

A second aspect of the invention includes a method of forming a stable nickel silicide layer, the method comprising: forming a nickel silicide layer on a silicon substrate; forming a fluorine-rich nickel layer over the nickel silicide layer by exposing the nickel silicide layer to a fluorine-containing plasma; and annealing the fluorine-rich nickel layer to drive the fluorine in the fluorine-rich nickel layer into the nickel silicide layer thereunder.

A third aspect of the invention related to an integrated circuit (IC) structure comprising: a transistor device including a fluorine containing nickel silicide layer in at least a portion of a source/drain region thereof, and a nickel hexafluoro silicide layer over the fluorine containing nickel silicide layer in the at least the portion of the source/drain region.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

Figure 8:
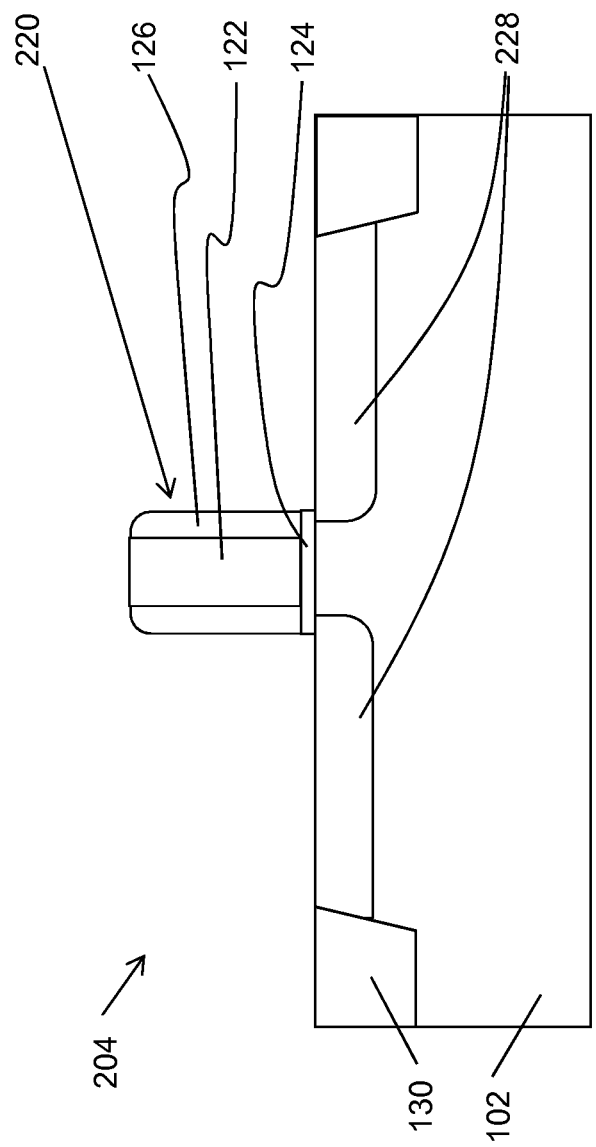
FIGS. 8-10 show cross-sectional views of a structure undergoing a method according to another embodiment of the disclosure, with FIG. 10 showing an IC structure according to an embodiment of the disclosure.
Figure 9:
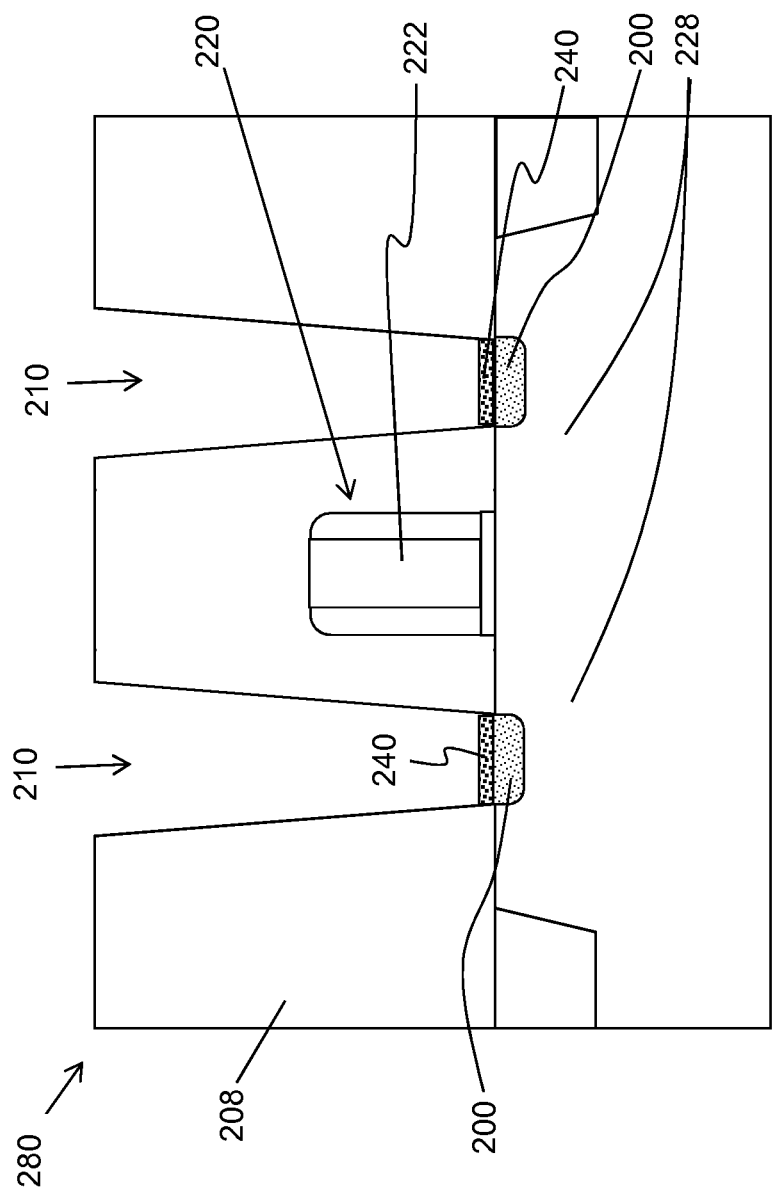
Figure 10:
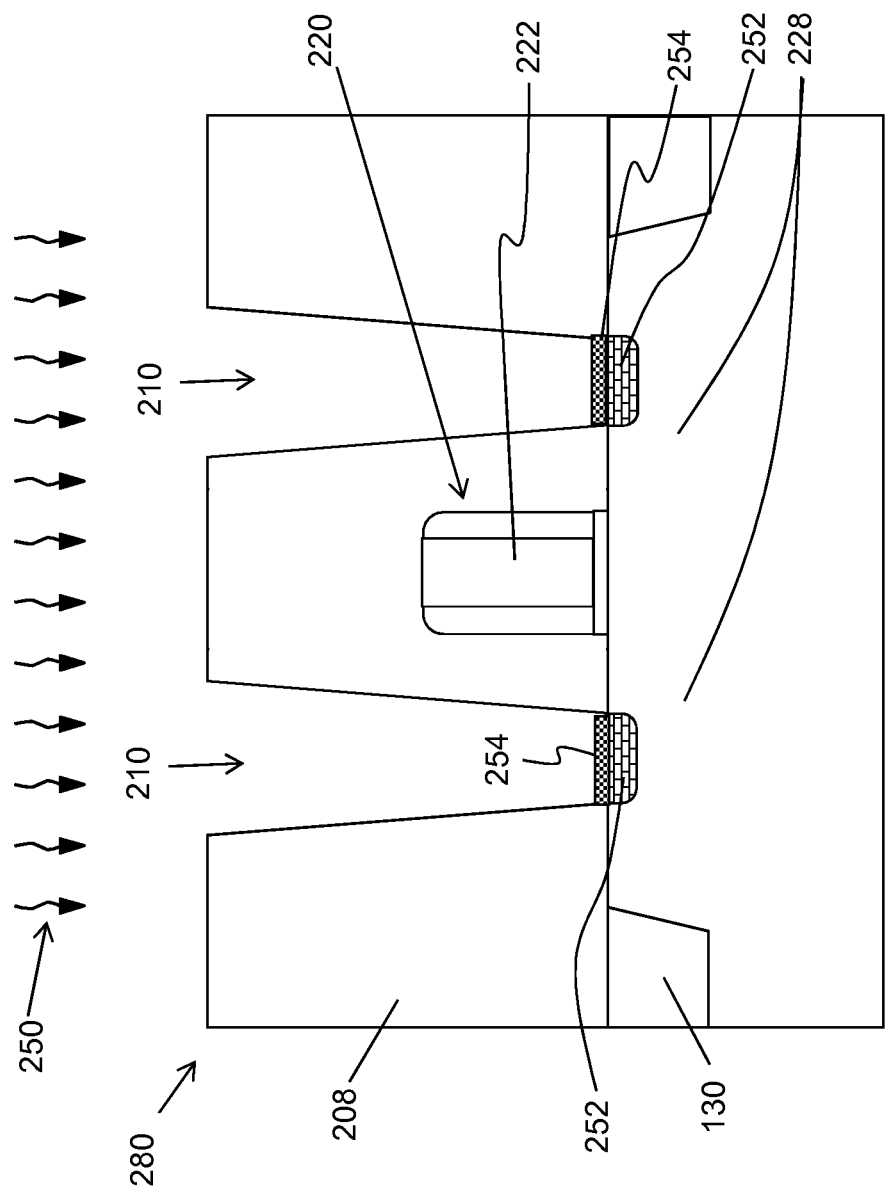

Referring to the drawings, methods of forming a stable nickel silicide are illustrated in the form of cross-sectional views. FIGS. 1-6 show cross-sectional views of a structure undergoing a 'silicide first' approach to the method according to embodiments of the disclosure. In this setting, a nickel silicide layer 100 is formed across source/drain region 128 of a transistor device 120 prior to application of the teachings of the disclosure. FIGS. 8-10 show cross-sectional views of a structure according to a 'silicide last' approach to a method according to another embodiment of the disclosure. In this approach, silicide is selectively formed in source/drain region 128. While the teachings of the invention will be described relative to parts of a transistor device, it is understood that the teachings can be applied to any nickel silicide application.

Figure 1:
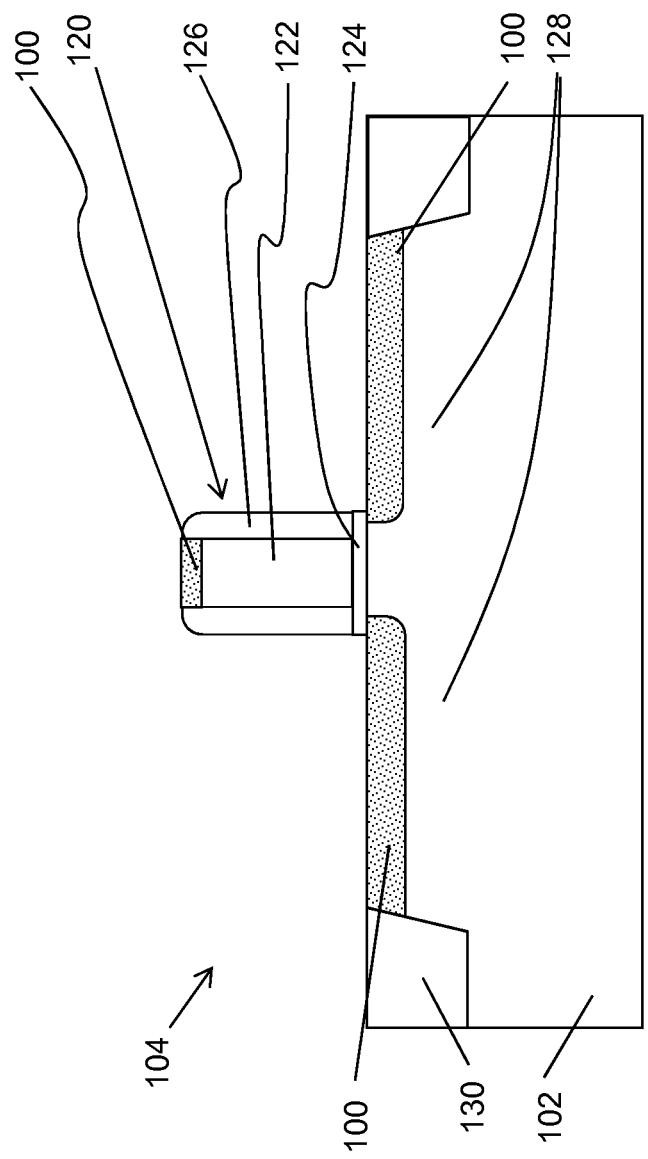
FIGS. 1-6 show cross-sectional views of a structure undergoing a method according to embodiments of the disclosure, with FIG. 6 showing an IC structure according to an embodiment of the disclosure.

FIG. 1 shows a preliminary structure 104 including a substrate 102 having a nickel silicide layer 100 formed therein. A transistor device 120 is also formed over substrate 102 using any conventional techniques. Transistor device 120 may include any now known or later developed structure, including for example: a gate 122 having a spacer 126 adjacent thereto, and a gate dielectric 124 (optional). Nickel silicide layer 100 may extend over source/drain region 128 and also may extend over gate 122 where the gate includes a semiconductor.

Substrate 102 may include a semiconductor material, which typically includes silicon, but may include other materials such as: silicon, germanium, silicon germanium, silicon carbide, and those materials consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire substrate 102 may be strained. Substrate 102 may include a bulk or a semiconductor-on-insulator arrangement.

Gate 122 may include any now known or later developed gate body material such as one of the semiconductor materials listed herein, or a metal such as tungsten (W) or aluminum (Al). In the latter case, nickel silicide layer 100 would not be present over gate 122. That is, where gate 122 includes a metal, nickel silicide layer 100 would not be present on gate 122. See e.g., FIGS. 8-10. As illustrated in FIGS. 1-6, gate 122 includes a semiconductor material capable of having nickel silicide layer 100 formed thereon. Spacer 126 may include any now known or later developed spacer material such as silicon nitride ($Si_3N_4$). Gate dielectric 124, where provided, may include but is not limited to: hafnium silicate (HfSiO), hafnium oxide ($HfO_2$), zirconium silicate ($ZrSiO_x$), zirconium oxide ($ZrO_2$), silicon oxide ($SiO_2$), silicon nitride ($Si_3N_4$), silicon oxynitride (SiON), high-k material or any combination of these materials.

Transistor device 120 may be formed using any now known or later developed techniques. As understood, trench isolations 130 are etched into substrate 102 and filled with an insulating material, such as oxide, to isolate one region of the substrate from an adjacent region of the substrate. Semiconductor or metal deposition for, e.g., gate 122, with related photoresist deposition and patterning, etching, chemical mechanical polishing (CMP), etc. may also be employed. Deposition of spacer 126 material followed by related etching may follow gate 122 formation. Source/drain region 128 may be doped with any appropriate dopant to establish either p-type (acceptors) or n-type (donors) conductivity. Dopants are of two types: "donors" and "acceptors". N type implants are donors and P type are acceptors. Common dopants in silicon include: for p-type, boron (B), indium (In), and for n-type, phosphorous (P), arsenic (As), antimony (Sb). Doping may be performed with a mask (or previously-formed, elements in place) so that only certain areas of substrate 102 will be doped.

Nickel silicide layer 100 may be formed on substrate 102 and gate 122 (where gate 122 includes a semiconductor) using any now known or later developed technique. For example, nickel silicide layer 100 may be formed by performing a remote plasma in-situ clean such as a SiCoNi in-situ clean available from Applied Materials (e.g., using a remote plasma of hydrogen ($H_2$), nitrogen trifluoride ($NF_3$) and ammonia ($NH_3$). A nickel layer may then be deposited over substrate 102 and gate 122, e.g., using a physical vapor deposition (PVD) or radio frequency PVD (RFPVD) to a thickness of approximately 5-25 nanometers. In one embodiment, the nickel layer may include a nickel platinum (NiPt) layer (not shown) with the platinum having an atomic percentage of 0-20%. Any necessary capping may also be carried out such as deposition of titanium nitride (TiN) by PVD for planar silicide or atomic layer deposition (ALD) for trench silicide. A PVD deposition is usually performed at low temperature, ranging from room temperature to 250° C., whereas an ALD deposition process is performed at higher temperatures, ranging from 200° C. to 400° C. Next, an annealing may be performed to form the nickel silicide layer wherever nickel (or nickel platinum) and silicon interface, followed by a final etching to remove a remaining nickel (or nickel platinum) layer over the nickel silicide layer. More specifically, the annealing may include a first anneal at a temperature in the range of approximately 200° C. and 400° C., followed by an optional first wet etch, and a second anneal at a temperature in the range of approximately 300° C. and 500° C. The first etching usually involves a wet solution, such as ammonia etching, sulfuric peroxide mixture, fluoridric acid, hydrochloric acid, nitric acid or a mixture of these elements. The final etching may include a wet etching composed of the same chemistries as described for the first etching, but typically in different compositions, time, or temperature. Nickel silicide layer 100 may include either form thereof, NiSi and/or $Ni_2Si$. As illustrated, in this embodiment, nickel silicide layer 100 is formed across source/drain regions 128 such that it extends laterally from gate 120 over substrate 102 to trench isolations 130 in substrate 102. That is, nickel silicide layer 100 forming includes forming the nickel silicide layer across a source/drain region 128 of transistor device 120. This approach may be referred to as 'silicide first' approach since the silicide is present prior to application of the teachings of the disclosure.

Figure 2:
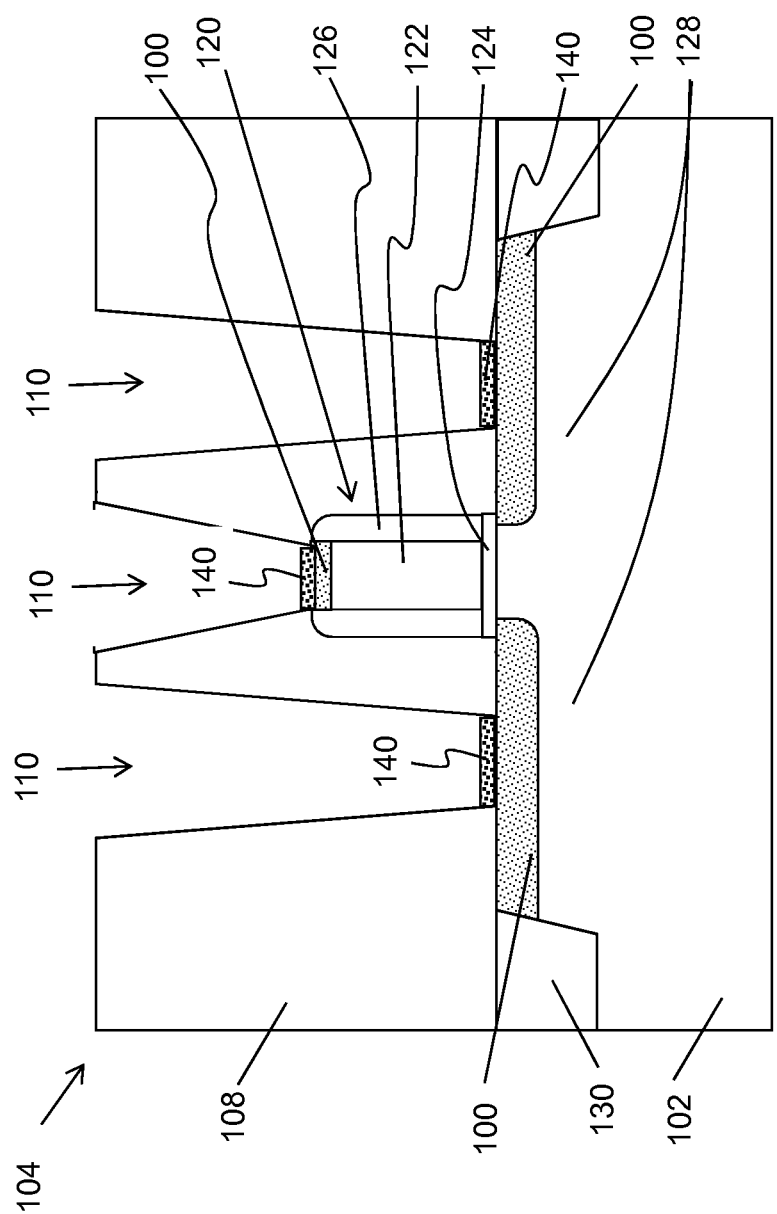
Figure 3:
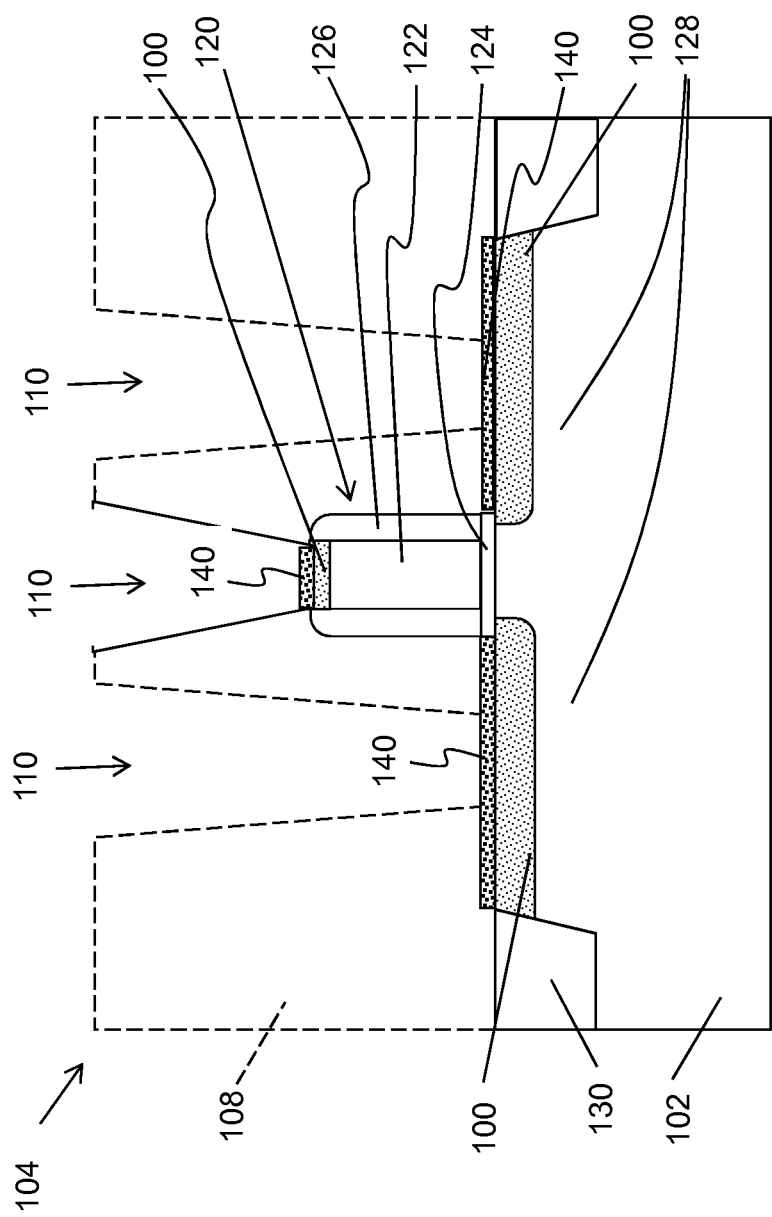

With reference to FIGS. 2 and 3, an embodiment of the disclosure also includes forming a fluorine-rich nickel layer 140 over nickel silicide layer 100, i.e., over at least a portion of source/drain region 128 and gate 122. Fluorine-rich nickel layer 140 forming may occur in a number of ways. In FIG. 2, fluorine-rich nickel layer 140 forming includes forming a patterned dielectric layer 108 over nickel silicide layer 100, e.g., by depositing layer 108 with a thickness ranging from 100 to 200 nm of silicon oxide and/or silicon nitride, depositing and patterning a photoresist and etching to form openings 110. Patterned dielectric layer 108 includes a plurality of openings 110 exposing selected regions of nickel silicide layer 100. As will be described, fluorine-rich nickel layer 140 is formed in plurality of openings 110. In one embodiment, openings 110 may expose regions of source/drain region 128 only, such that fluorine-rich nickel layer 140 forms only over selected portions of source/drain regions 128. Alternatively, where nickel silicide layer 100 is formed over gate 122 of transistor device 120, patterned dielectric layer 108 may also include an opening 110 over gate 122 such that fluorine-rich nickel layer 140 also forms over the gate. In one embodiment, fluorine-rich layer 140 forming may include performing a reactive ion etching (RIE) using a fluorine-containing plasma. Alternatively, fluorine-rich nickel layer 140 forming may include exposing nickel silicide layer 100 to a fluorine-containing plasma, i.e., without etching. In any event, as will be described, the various processes unexpectedly create a form of $NiSiF_x$ (here, $NiSiF_6$).

Referring to FIG. 3, in an alternative embodiment, prior to formation of patterned dielectric 108 (shown in phantom), fluorine-rich layer 140 is formed across source/drain region 128. In this case, fluorine-rich layer 140 forming may include performing a reactive ion etching (RIE) using a fluorine-containing plasma. This step may be performed as part of spacer 126 etching or as a separate step. In conventional spacer etch processing, a follow on selective etch would be performed to remove any fluorine-containing layer from nickel silicide layer 100. However, that step would be skipped per the teachings of this disclosure as the fluorine-rich nickel layer is now used as a source of fluorine to stabilize nickel silicide layer 100. Alternatively to a RIE in a fluorine-containing plasma, fluorine-rich nickel layer 140 forming may include exposing nickel silicide layer 100 to a fluorine-containing plasma, i.e., without etching. Patterned dielectric layer 108 may be formed thereafter, as shown in phantom in FIG. 3 and as will be described herein. In either case, the plasma process for the $NiSiF_6$ formation may include employing a mix of fluoromethane ($CH_3F$), oxygen ($O_2$) and helium (He) with a pressure in the range of approximately 30-50 milliTorr. The application may occur in various steps having different power settings and durations. For example, a first step may be in the range of approximately 1400 W to 1600 W, and a second step may be in the range of approximately 700 W-900 W with durations of approximately 20-24 seconds and approximately 40-50 seconds, respectively.

Fluorine-rich nickel layer 140 may include nickel hexafluoro silicide ($NiSiF_6$); although, other forms may be possible. "Fluorine-rich" as used herein indicates that fluorine is a majority constituent by 33 atomic percent of fluorine-rich nickel layer 140. As shown in FIG. 2, where patterned dielectric layer 108 is formed prior to fluorine-rich nickel layer 140, fluorine-rich nickel layer 140 forming occurs in plurality of openings 110 in dielectric layer 108, and on the exposed nickel silicide layer 100. In contrast, as shown in FIG. 3, where patterned dielectric layer 108 (in phantom) is formed after fluorine-rich nickel layer 140, fluorine-rich nickel layer 140 forming occurs across all of nickel silicide layer 100 in source/drain region 128.

As noted, dielectric layer 108 may be deposited and patterned to provide openings 110, e.g., using a patterned photoresist and etching in a known fashion, either before formation of fluorine-rich nickel layer 140 or after formation thereof. Dielectric layer 108 may include but is not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. As used herein, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The following description shows continuing processing relative to the FIG. 2 embodiment only for brevity, but it will be readily understood that the teachings are equally applicable to the FIG. 3 embodiment.

Figure 4:
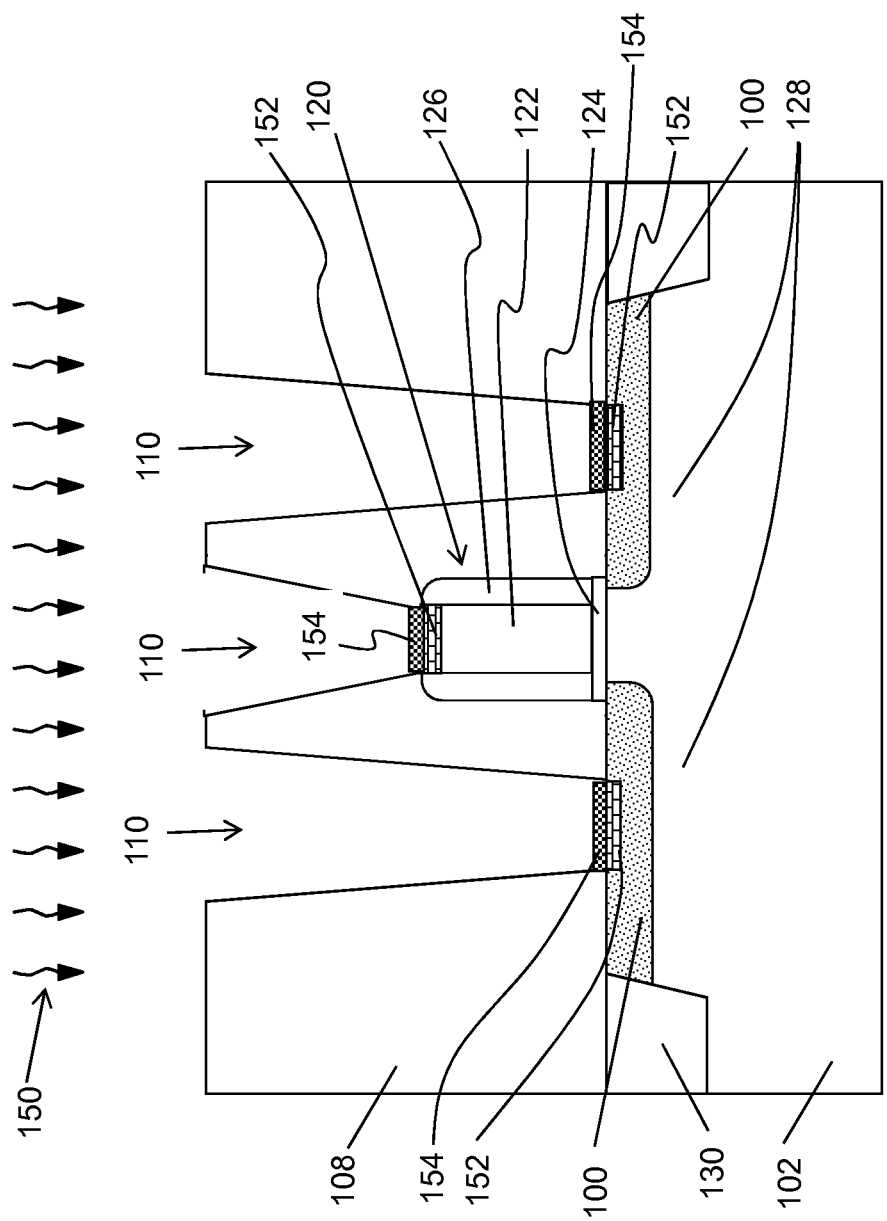

FIG. 4 shows subjecting fluorine-rich nickel layer 140 (FIGS. 2 and 3) to a process 150 that drives the fluorine in fluorine-rich nickel layer 140 (FIGS. 2-3) into nickel silicide layer 100 thereunder. In one embodiment, the process may include a laser annealing, which has been unexpectedly found help to help maintain the fluorine-rich layer 140 as a source of fluorine diffusion. Laser annealing occurs after fluorine-rich layer 140 formation, i.e., after the RIE for spacer 126 or exposure to fluorine containing plasma but without an etching that would remove layer 140. In one example, the wafer can be pre-heated using a hot chuck and/or a pre-heat laser, e.g., an 880 nanometer indium gallium arsenide (InGaAs) laser, to a temperature in the range of approximately 200° C. to 400° C. The wafer can then be laser annealed to the target temperature with a carbon dioxide ($CO_2$) laser or an InGaAs laser at temperature in the range of approximately 700° C. to 1000° C., and more particularly, a temperature of approximately 800° C. In either case, "approximately" may range +/−10° C. The laser annealing may have a duration of approximately 0.5 milliseconds (ms)(+/−0.2 ms). Although one example has been described, alternative laser annealing devices and processes may be employed in this setting. In an alternative embodiment, the process may include a blanket annealing, such as a rapid thermal annealing (RTP) having a longer duration than the laser anneal ranging from 1 to 60 seconds, with temperatures ranging from 400° C. to 650° C. In another embodiment, the process may include the use of a furnace annealing, with an annealing time ranging from 10 mins to several hours, and a temperature ranging from 200° C. to 400° C. For these different anneals, the anneal ambient might include nitrogen ($N_2$), argon (Ar), nitrogen hydrogen ($N_2H_2$) with a hydrogen content lower than 5%, and argon hydrogen ($ArH_2$), with an hydrogen content lower than 5%.

As shown in FIG. 4, the result of process 150 is that fluorine from fluorine-rich nickel layer 140 (FIGS. 1-2) is driven into nickel silicide layer 100 wherever present. Nickel silicide layer 100 is transformed into a fluorine containing nickel silicide layer 152 having a nickel silicide, fluorine-containing layer ($NiSIF_x$) 154 thereover. Layer 152 may take the form of nickel hexafluoro silicide ($NiSiF_6$); however, other forms may be possible. Depending on the thickness of nickel silicide layer 100, fluorine may disperse entirely through the layer or only partially (shown), leaving non-fluorine containing nickel silicide layer 100 thereunder.

Figure 5:
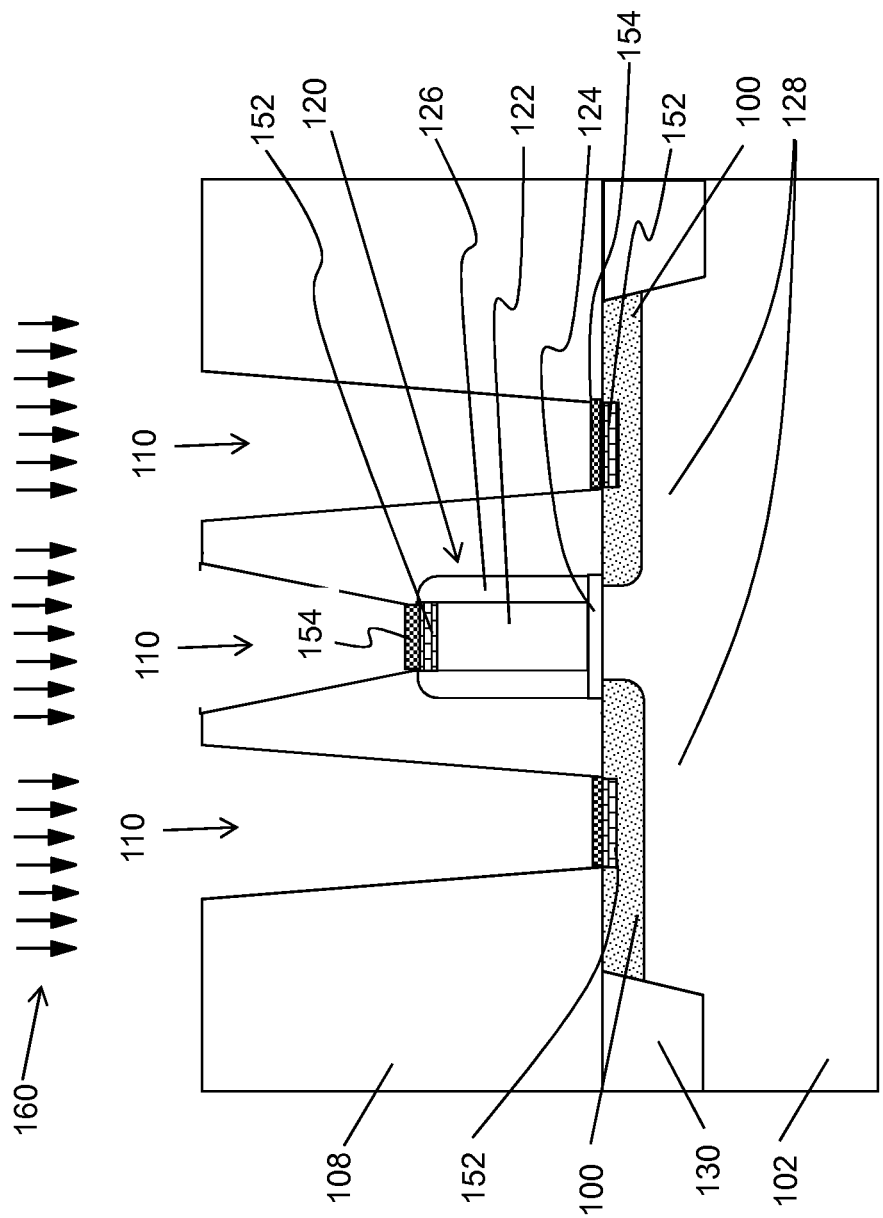

As shown in FIG. 5, a selective etching 160 may be carried after process 150, leaving a thinner nickel silicide, fluorine-containing layer ($NiSIF_x$) 154 over fluorine containing nickel silicide layer 152 (right side FIG. 5). Etching 160 may include any now known or later developed etching process selective to silicide such as wet chemistries employing nitric acid, hydrochloric acid, fluoric acid or mixtures thereof such as aqua regia, a mixture of nitric and hydrofluoric acid. In any event, the fluorine remains in fluorine containing nickel silicide layer 152, making that layer more stable and increasing its agglomeration temperature.

Figure 6:
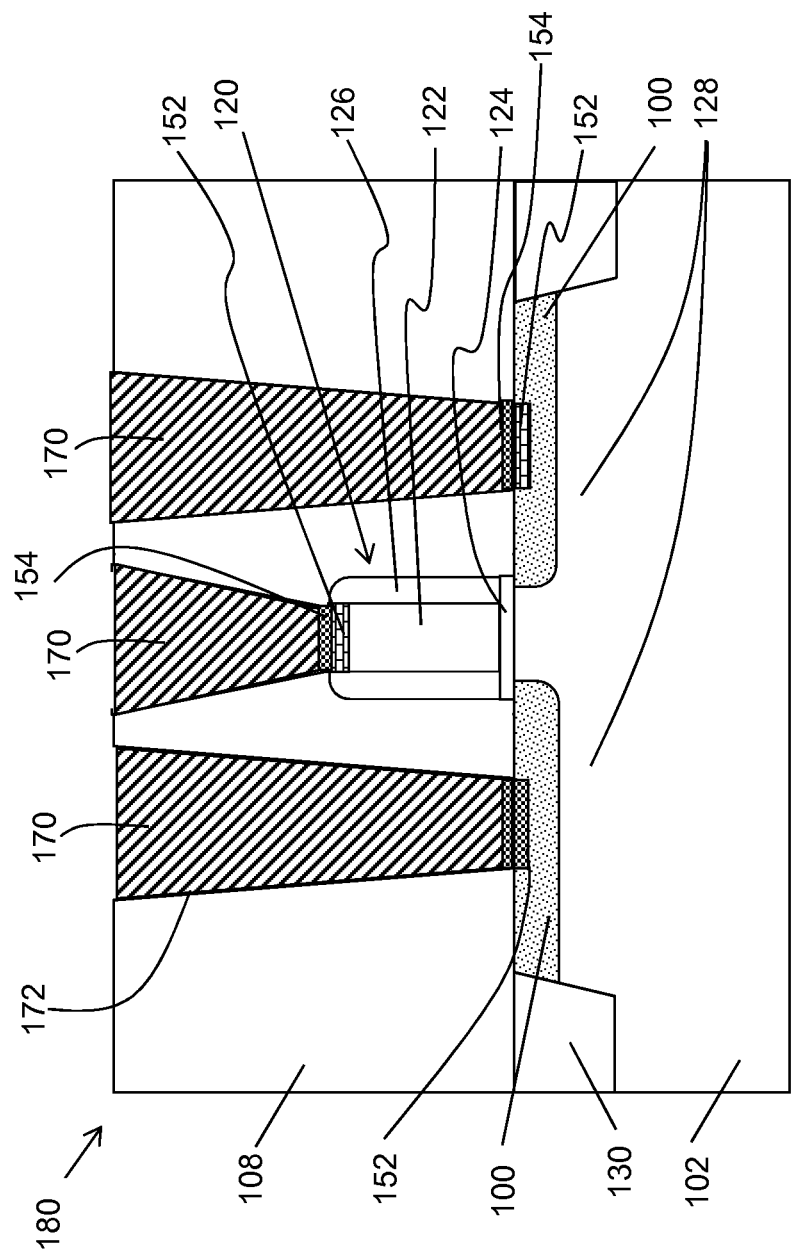

FIG. 6 shows the structure after subsequent processing of, inter alia, forming a contact 170 in each opening 110 (FIGS. 3-5). Contacts 170 may be formed using any now known or later developed technique. For example, a refractory liner 172 may be deposited of, for example, tantalum (Ta), titanium (Ti), tungsten (W), ruthenium (Ru), iridium (Ir), rhodium (Rh) and platinum (Pt), titanium nitride (TiN), cobalt (Co), etc., or mixtures or stacks thereof. The refractory liner may be deposited using a radio-frequency physical vapor deposition (RFPVD) technique, an atomic layer deposition (ALD) technique, or a chemical vapor deposition technique (CVD), or a combination of these techniques. The deposition of liner 172 may be preceded by a surface cleaning or a surface preparation, that can include the use of a remote plasma of hydrogen ($H_2$), nitrogen trifluoride ($NF_3$) and ammonia ($NH_3$), or a physical cleaning such as an argon (Ar) directional plasma sputtering, and/or of a degas step at temperatures ranging from 200 to 400° C. during times ranging from 30 sec to 5 mins, in an ambient typically made of a inert gas such as nitrogen ($N_2$) or argon (Ar). A metal such as copper (Cu), aluminum (Al), tungsten (W), or cobalt (Co) may then be deposited to fill each opening 110 (FIG. 4), using a deposition technique such as RFPVD technique, ALD, or CVD, followed by a chemical mechanical polish (CMP). As known, CMP removes layers of solid by chemical-mechanical polishing.

Figure 7:
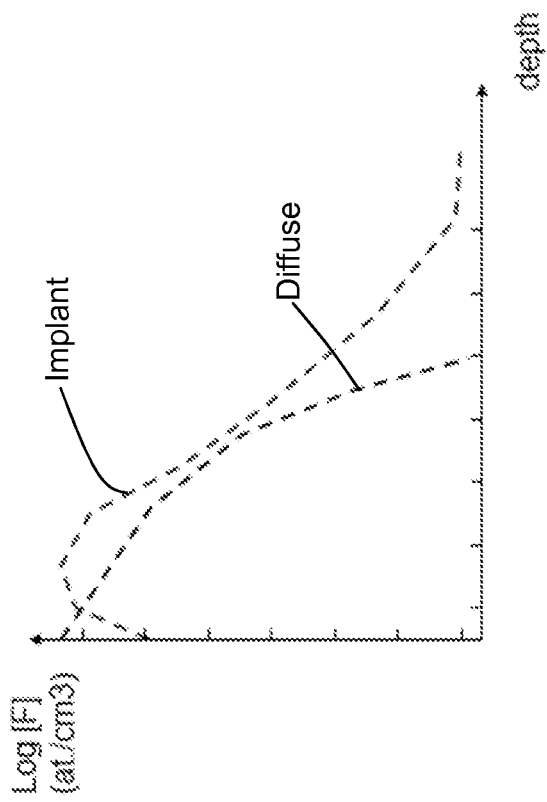
FIG. 7 shows a graph of fluorine concentration versus depth for ion implantation compared to diffusion according to embodiments of the disclosure.

FIG. 6 also shows a resulting integrated circuit (IC) structure 180. IC structure 180 includes transistor device 120 including a fluorine containing nickel silicide layer 152 in at least a portion of source/drain region 128 thereof, and a nickel hexafluoro silicide layer 154 over fluorine containing nickel silicide layer 152 in the at least the portion of the source/drain region. Where provided, IC structure 180 may also include fluorine containing nickel silicide layer 152 in gate 122 thereof, and nickel hexafluoro silicide layer 154 over the fluorine containing nickel silicide layer in the gate. Each layer 152, 154 may be formed across all of source/drain region 128 where the FIG. 3 embodiment is employed. In contrast to conventional processes, the teachings of the disclosure result in a stable nickel silicide layer 152 without ion implantation into other areas such as isolation regions 130. That is, isolation region 130 adjacent to source/drain region 128 is free of fluorine since the former is protected from the plasma by layer 108. Also, as illustrated in the graph of FIG. 7, in contrast to conventional ion implantation processes, the fluorine dispersion in nickel silicide layer 152 takes on that of a diffused material compared to an ion implanted material. That is, a fluorine concentration is highest as a surface of layer 152 and gradually decreases to a particular depth via the teachings of the disclosure, while with ion implantation, the highest concentration is below the surface and the concentration extends deeper into layer 152.

Referring to FIGS. 8 and 9, in an alternative embodiment, a nickel silicide layer 200 forming may occur in selective regions of a source/drain region 228. This approach may be referred to as a "silicide last" approach. In this setting, as shown in FIG. 8, a preliminary structure 204 includes transistor device 220 but does not include nickel silicide. Here, as shown in FIG. 9, nickel silicide layer 200 forming includes forming a patterned dielectric layer 208 over source/drain region 228 of transistor device 220. Dielectric layer 208 may be formed and include materials as described herein relative to layer 208. As described previously, patterned dielectric layer 208 includes a plurality of openings 210 exposing selected regions of source/drain region 128. No opening to gate 222 is shown here to illustrate how a metal gate 222 would omit formation of nickel silicide layer 200 thereon. As illustrated, nickel silicide layer 200 is formed in portions of source/drain region 228 through plurality of openings 210. Nickel silicide layer 200 may be formed as described herein. Fluorine-rich nickel layer 240 is then formed in plurality of openings 210 over nickel silicide layer 200, e.g., using a fluorine-containing plasma. In this manner, only selective regions of source/drain region 228 include nickel silicide layer 200 and fluorine-rich nickel layer 240, as compared to the FIGS. 2 and 3 embodiments.

FIG. 10 shows the FIGS. 8-9 embodiment after subjecting fluorine-rich nickel layer 240 (FIGS. 2 and 3) to a process 250 that drives the fluorine in fluorine-rich nickel layer 240 into nickel silicide layer 200 thereunder. Process 250 may be substantially identical to that describe relative to FIG. 4. Nickel silicide layer 200 is transformed into a fluorine containing nickel silicide layer 252 having a nickel silicide, fluorine-containing layer (NiSIF$_x$) 254 thereover. Layer 252 may take the form of nickel hexafluoro silicide (NiSiF$_6$); however, other forms may be possible. Again, depending on the thickness of nickel silicide layer 200, fluorine may disperse entirely through the layer (shown) or only partially (FIG. 5-6). Subsequent processing may include forming a contact in each opening, as described relative to FIG. 6.

FIG. 10 also shows a resulting integrated circuit (IC) structure 280. IC structure 280 includes transistor device 220 including a fluorine containing nickel silicide layer 252 in a portion of source/drain region 228 thereof, and a nickel hexafluoro silicide layer 254 over fluorine containing nickel silicide layer 252 in the source/drain region. Here, IC structure 180 does not include fluorine containing nickel silicide layer in metal gate 222 thereof, nor does it include fluorine in isolation regions 130.

Figure 11:
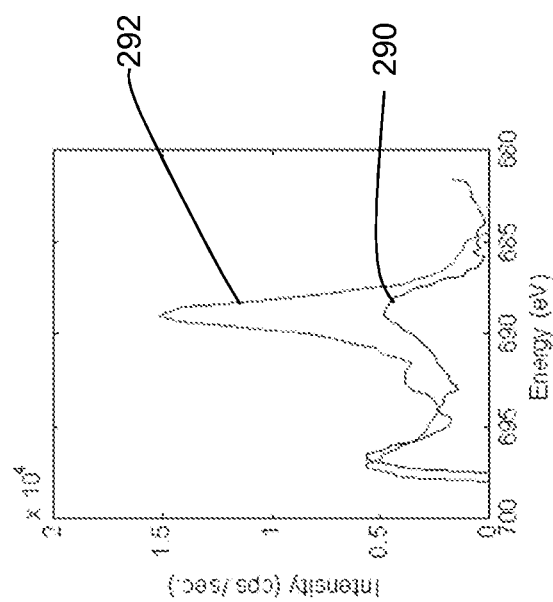
FIG. 11 shows an illustrative graphical representation of an x-ray photoelectron spectrometry analysis of a structure created according to the various embodiments of the disclosure.

FIG. 11 shows a graphical representation of a chemical analysis of IC structure 180, 280 formed according to embodiments of the disclosure. The graph illustrates an amount of fluorine in fluorine containing nickel silicide layer 152, 252. The chemical analysis can be carried out by any known technique such as but not limited to X-ray photoelectron spectroscopy. Line 290 in the graph represents conventional techniques, while that of line 292 shows the results per embodiments of the disclosure. As illustrated, higher amount of fluorine is incorporated into layer 152, 252 compared to conventional techniques (see value at approximately 865 eV), which results in a more stable nickel silicide layer. In addition, since the embodiments of the disclosure avoid ion implantation, damage that can be caused to layer 152, 252 is avoided. It is not expected that the fluorine based plasma treatment will create a form of NiSiFx (here, NiSiF6).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a stable nickel silicide layer, the method comprising:
    forming a nickel silicide layer;
    forming a fluorine-rich nickel layer over the nickel silicide layer; and
    subjecting the fluorine-rich nickel layer to a process that drives the fluorine in the fluorine-rich nickel layer into the nickel silicide layer thereunder.

2. The method of claim 1, wherein the process includes a laser annealing.

3. The method of claim 2, wherein the laser annealing uses a temperature of between approximately 750° C. and 850° C.

4. The method of claim 3, wherein the laser annealing uses a temperature of approximately 800° C.

5. The method of claim 2, wherein the laser annealing has a duration of approximately 0.5 milliseconds.

6. The method of claim 1, wherein the process includes a blanket annealing.

7. The method of claim 1, wherein the fluorine-rich nickel layer forming includes performing a reactive ion etching (RIE) using a fluorine-containing plasma.

8. The method of claim 7, wherein the process includes a laser annealing occurring after the RIE.

9. The method of claim 1, wherein the fluorine-rich nickel layer forming includes exposing the nickel silicide layer to a fluorine-containing plasma.

10. The method of claim 1, wherein the fluorine-rich nickel layer includes nickel hexafluoro silicide ($NiSiF_6$).

11. The method of claim 1, wherein the nickel silicide layer forming includes forming the nickel silicide layer across a source/drain region of a transistor device, and
wherein the fluorine-rich nickel layer forming includes forming a patterned dielectric layer over the nickel silicide layer, the patterned dielectric layer including a plurality of openings exposing selected regions of the nickel silicide layer and forming the fluorine-rich nickel layer in the plurality of openings.

12. The method of claim 11, wherein the nickel silicide layer forming further includes forming the nickel silicide layer over a gate of the transistor device, and wherein the patterned dielectric layer includes an opening over the gate such that the fluorine-rich nickel layer also forms over the gate.

13. The method of claim 1, wherein the nickel silicide layer forming includes forming a patterned dielectric layer over a source/drain region of a transistor device, the patterned dielectric layer including a plurality of openings exposing selected regions of the source/drain region, and forming the nickel silicide layer in portions of the source/drain region through the plurality of openings; and
wherein the fluorine-rich nickel layer forming includes forming the fluorine-rich nickel layer in the plurality of openings over the nickel silicide layer.

14. The method of claim 13, wherein the transistor device includes a spacer thereon, and wherein the fluorine-rich nickel layer forming includes performing a reactive ion etching (RIE) of the spacer using a fluorine-containing plasma.

15. A method of forming a stable nickel silicide layer, the method comprising:
forming a nickel silicide layer;
forming a fluorine-rich nickel layer over the nickel silicide layer by exposing the nickel silicide layer to a fluorine-containing plasma; and
annealing the fluorine-rich nickel layer to drive the fluorine in the fluorine-rich nickel layer into the nickel silicide layer thereunder.

16. The method of claim 15, wherein the annealing includes a laser annealing.

17. The method of claim 15, wherein the fluorine-rich nickel layer forming includes performing a reactive ion etching (RIE) using the fluorine-containing plasma.

* * * * *